(12) United States Patent
Meyer, IV et al.

(10) Patent No.: US 8,792,238 B2
(45) Date of Patent: Jul. 29, 2014

(54) HEAT-DISSIPATING MODULE HAVING LOOP-TYPE VAPOR CHAMBER

(75) Inventors: George Anthony Meyer, IV, Morgan Hill, CA (US); Chien-Hung Sun, Zhongli (TW); Chieh-Ping Chen, Zhongli (TW); Yung-Tai Lu, Zhongli (TW); Ming-Kuei Hsieh, Zhongli (TW)

(73) Assignee: Celsia Technologies Taiwan, Inc., Taoyuan County (TW)

( * ) Notice: Subject to any disclaimer, the term of this patent is extended or adjusted under 35 U.S.C. 154(b) by 288 days.

(21) Appl. No.: 13/365,739

(22) Filed: Feb. 3, 2012

(65) Prior Publication Data

US 2013/0199757 A1    Aug. 8, 2013

(51) Int. Cl.
| | |
|---|---|
| F28D 15/04 | (2006.01) |
| H05K 7/20 | (2006.01) |
| F28D 15/02 | (2006.01) |
| H01L 23/427 | (2006.01) |
| H01L 23/473 | (2006.01) |
| F28F 13/00 | (2006.01) |

(52) U.S. Cl.
CPC ............ *F28D 15/04* (2013.01); *F28D 15/0233* (2013.01); *H05K 7/2029* (2013.01); *H01L 23/427* (2013.01); *H01L 23/473* (2013.01); *F28F 2013/006* (2013.01)
USPC ...... 361/688; 361/700; 361/701; 361/679.52; 165/104.21; 165/104.26; 165/104.33

(58) Field of Classification Search
CPC ... F28D 15/04; F28D 15/0233; H01L 23/427; H01L 23/473; H05K 7/2029; F28F 2013/005; F28F 2013/006
USPC ........ 361/688, 700, 701, 679.52; 165/104.21, 165/104.26, 104.33
See application file for complete search history.

(56) References Cited

U.S. PATENT DOCUMENTS

| | | | | |
|---|---|---|---|---|
| 5,006,924 | A * | 4/1991 | Frankeny et al. | 257/714 |
| 5,323,292 | A * | 6/1994 | Brzezinski | 361/689 |
| 5,508,884 | A * | 4/1996 | Brunet et al. | 361/698 |
| 5,694,295 | A * | 12/1997 | Mochizuki et al. | 361/699 |
| 6,082,443 | A * | 7/2000 | Yamamoto et al. | 165/104.26 |
| 6,490,160 | B2 * | 12/2002 | Dibene et al. | 361/700 |
| 6,650,544 | B1 * | 11/2003 | Lai | 361/700 |
| 6,874,568 | B2 * | 4/2005 | Lai | 165/104.26 |
| 7,342,306 | B2 * | 3/2008 | Colbert et al. | 257/712 |
| 7,435,622 | B2 * | 10/2008 | Colbert et al. | 438/118 |
| 7,599,185 | B2 * | 10/2009 | Meyer et al. | 361/700 |
| 8,018,719 | B2 * | 9/2011 | Busch | 361/700 |
| 2006/0039111 | A1 * | 2/2006 | Huang | 361/698 |
| 2007/0056714 | A1 * | 3/2007 | Wong | 165/104.26 |

(Continued)

*Primary Examiner* — Anatoly Vortman
(74) *Attorney, Agent, or Firm* — Chun-Ming Shih; HDLS IPR Services

(57) ABSTRACT

A heat-dissipating module having a loop-type vapor chamber includes a heat-dissipating body, a loop-type vapor chamber, and a heat-conducting medium. The loop-type vapor chamber is completely covered by the heat-dissipating body. The loop-type vapor chamber includes a loop body, a wick structure and a supporting structure. The loop body includes a bottom plate and a cover plate. A vacuum chamber is formed between the bottom plate and the cover plate. The wick structure is arranged on inner surfaces of the cover plate and the bottom plate. The supporting structure abuts the wick structure toward the cover plate and the bottom plate. The loop-type vapor chamber is tightly connected to the heat-dissipating body via the heat-conducting medium.

12 Claims, 8 Drawing Sheets

(56) References Cited

U.S. PATENT DOCUMENTS

2007/0204646 A1* 9/2007 Gagliano .................. 62/389
2007/0240860 A1* 10/2007 Meyer et al. ............. 165/104.26
2008/0266800 A1* 10/2008 Lankston et al. ............. 361/700
2009/0151906 A1* 6/2009 Lai et al. .................. 165/104.26
2009/0242169 A1* 10/2009 Meyer et al. ................. 165/80.3
2011/0067844 A1* 3/2011 Meyer et al. ............. 165/104.26
2011/0232877 A1* 9/2011 Meyer et al. ............. 165/104.26
2011/0315351 A1* 12/2011 Meyer et al. ............. 165/104.26

* cited by examiner

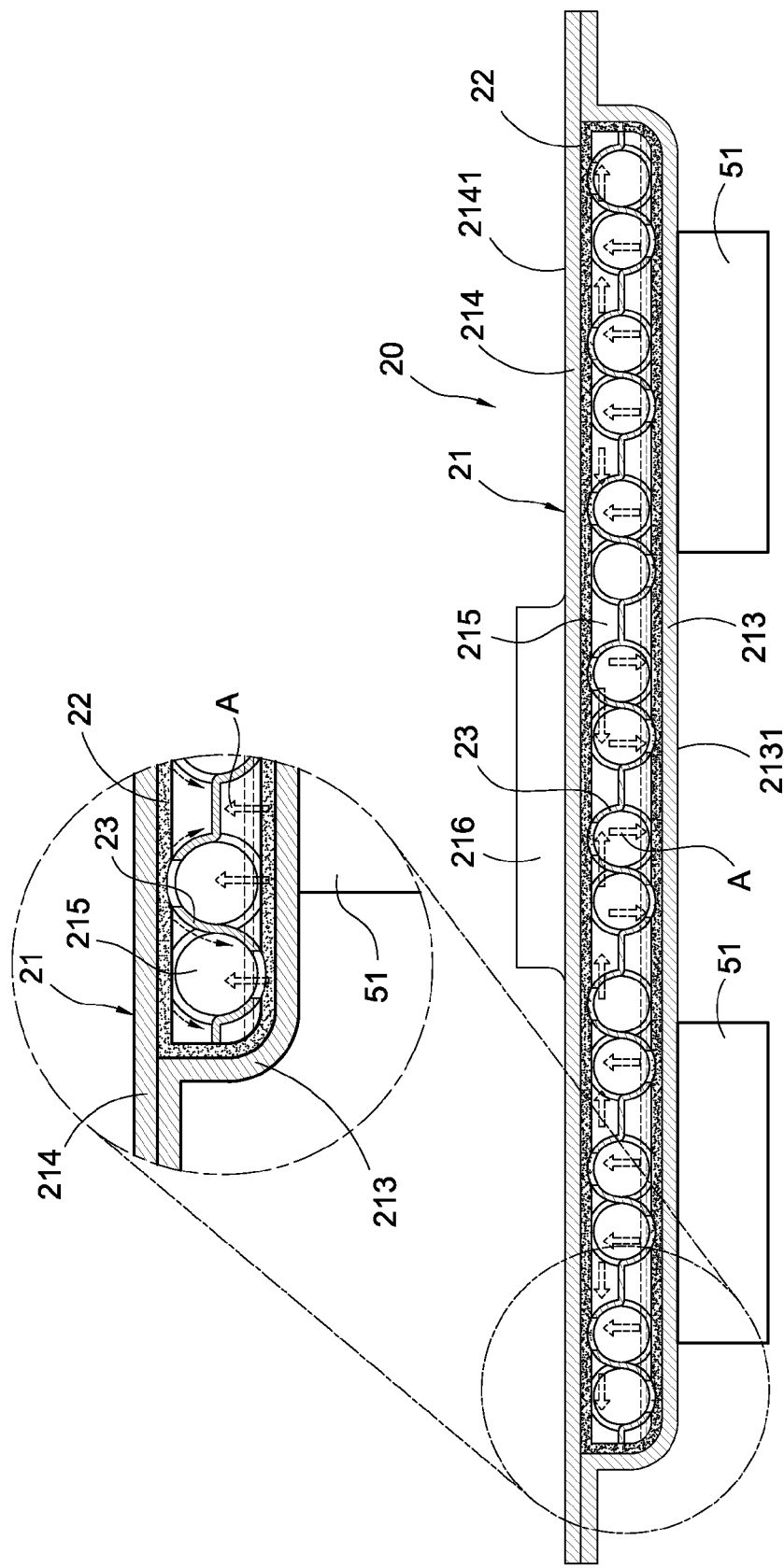

HEAT-DISSIPATING MODULE HAVING LOOP-TYPE VAPOR CHAMBER

BACKGROUND OF THE INVENTION

1. Field of the Invention

The present invention relates to a heat-dissipating module, and in particular to a heat-dissipating module having a loop-type vapor chamber.

2. Description of Prior Art

Since modern electronic products are made more compact than before, more electronic elements have to be disposed in such a limited space inside the modern electronic product. In order to maintain these electronic elements at a normal working temperature and achieve the optimal performance as well as to prevent the electronic elements from suffering damage due to its overheating, it is an important issue to dissipate the heat generated by the modern electronic product rapidly. Thus, the volume and the heat-dissipating effect are important factors in designing a heat-dissipating module. Even, the heat-dissipating module is required to have a good heat-dissipating effect with a small volume. On the other hand, the heat-dissipating module is required to dissipate the heat generated by a plurality of electronic elements simultaneously. Therefore, the present invention aims to dissipate the heat generated by a plurality of heat sources simultaneously.

The conventional heat-dissipating module includes a loop heat pipe and a heat-dissipating body. The interior of the loop heat pipe is provided with a wick structure. One side of the loop heat pipe is an evaporating portion, and the opposite side thereof is a condensing portion. The heat-dissipating body is connected to the condensing portion, and the evaporating portion is connected to an electronic element with heat to be dissipated. The heat generated by the electronic element is conducted to a portion of the wick structure in the evaporating portion. Then, a portion of the working liquid in the wick structure absorbs the heat generated by the electronic element and evaporates to become vapor. The vapor-phase working liquid flows to the condensing portion of the loop heat pipe and releases its latent heat to the heat-dissipating body. Thereafter, the heat absorbed by the portion of the wick structure in the condensing portion is dissipated to the outside via the heat-dissipating body, so that the vapor-phase working fluid condenses to flow from the condensing portion back to the evaporating portion via the capillary force generated in the wick structure. By means of the circulation and phase change of the working fluid, the heat generated by the electronic element can be carried away.

The conventional heat-dissipating module has problems as follows. The path of the condensed working liquid for flowing back to the evaporating portion is so long that the condensed working liquid may heat-exchange with the air outside the loop heat pipe when the condensed working liquid flows back to the evaporating portion. As a result, the temperature of the working liquid arriving the evaporating portion is not low enough to carry away an expected amount of heat of the electronic element, which makes the electronic element unable to be cooled sufficiently. Thus, the conventional heat-dissipating module is capable of cooling only one electronic element. If a plurality of electronic elements is to be cooled, a plurality of heat-dissipating modules has to be provided for the respective electronic elements, so that the heat-dissipating modules inevitably occupy too much space in the electronic product.

SUMMARY OF THE INVENTION

The present invention is to provide a heat-dissipating module having a loop-type vapor chamber, which is brought into thermal contact with a plurality of heat-generating electronic elements on a circuit board. On side of the loop-type vapor chamber is brought into thermal contact with the heat-dissipating body. The other side of the loop-type vapor chamber is provided with a plurality of fixing plates. By this arrangement, the plurality of heat-generating elements can be cooled.

The present invention provides a heat-dissipating module having a loop-type vapor chamber, which includes a heat-dissipating body, a loop-type vapor chamber, and a heat-conducting medium. The heat-dissipating body is provided with an insertion trough. The loop-type vapor chamber is disposed at a position corresponding to that of the insertion trough and completely covered by the heat-dissipating body. The loop-type vapor chamber comprises a loop body, a wick structure and a supporting structure. The loop body comprises a bottom plate and a cover plate covering the bottom plate. A vacuum chamber is formed between the bottom plate and the cover plate. The wick structure is arranged on inner surfaces of the cover plate and the bottom plate. The supporting structure abuts the wick structure toward the cover plate and the bottom plate. The loop-type vapor chamber is tightly connected to the heat-dissipating body via the heat-conducting medium.

The present invention provides a heat-dissipating module having a loop-type vapor chamber, which is mounted on a plurality of heat-generating electronic elements of a circuit board and includes a heat-dissipating body, a loop-type vapor chamber, a heat-conducting medium, and a plurality of fixing plates. The loop-type vapor chamber is disposed on one side of the heat-dissipating body and completely covered by the heat-dissipating body. The loop-type vapor chamber comprises a loop body, a wick structure and a supporting structure. The loop body is enclosed by two long sides and two short sides to form a hollow rectangular body. A vacuum chamber is formed in the interior of the long sides and the short sides. The wick structure is arranged on inner surfaces of the long sides and the short sides. The supporting structure abuts the wick structure toward the inner surfaces of the long sides and the short sides. The loop-type vapor chamber is tightly connected to the heat-dissipating body via the heat-conducting medium. Some of the fixing plates are disposed to cross the connecting portions between the long sides and the short sides, and the rest of the fixing plates are disposed to across the long sides. The fixing plates are arranged in parallel to each other symmetrically and positioned to correspond to the heat-generating electronic elements respectively.

The present invention has advantageous features as follows. The loop-type vapor chamber is constituted of a cover plate and a bottom plate to form a flat loop body, thereby reducing the volume and space occupied by the heat-dissipating module. Further, since the heat-conducting medium is made of heat-conducting glue or solder having high heat conductivity, the heat transfer rate between the loop-type vapor chamber and the heat-dissipating body can be increased to improve the cooling rate. In addition, the path of the liquid-phase working fluid flowing from separation portions and the condensing portion back to the evaporating portion is short, so that the temperature of the liquid-phase working liquid arriving the evaporating portion is still low enough to carry away sufficient amount of heat of the electronic elements. Thus, the cooling effect of the present invention is enhanced.

BRIEF DESCRIPTION OF DRAWING

FIG. 8 is a cross-sectional view of the present invention taken along the line 8-8.

DETAILED DESCRIPTION OF THE INVENTION

The detailed description and technical contents of the present invention will become apparent with the following detailed description accompanied with related drawings. It is noteworthy to point out that the drawings is provided for the illustration purpose only, but not intended for limiting the scope of the present invention.

Figure 1:
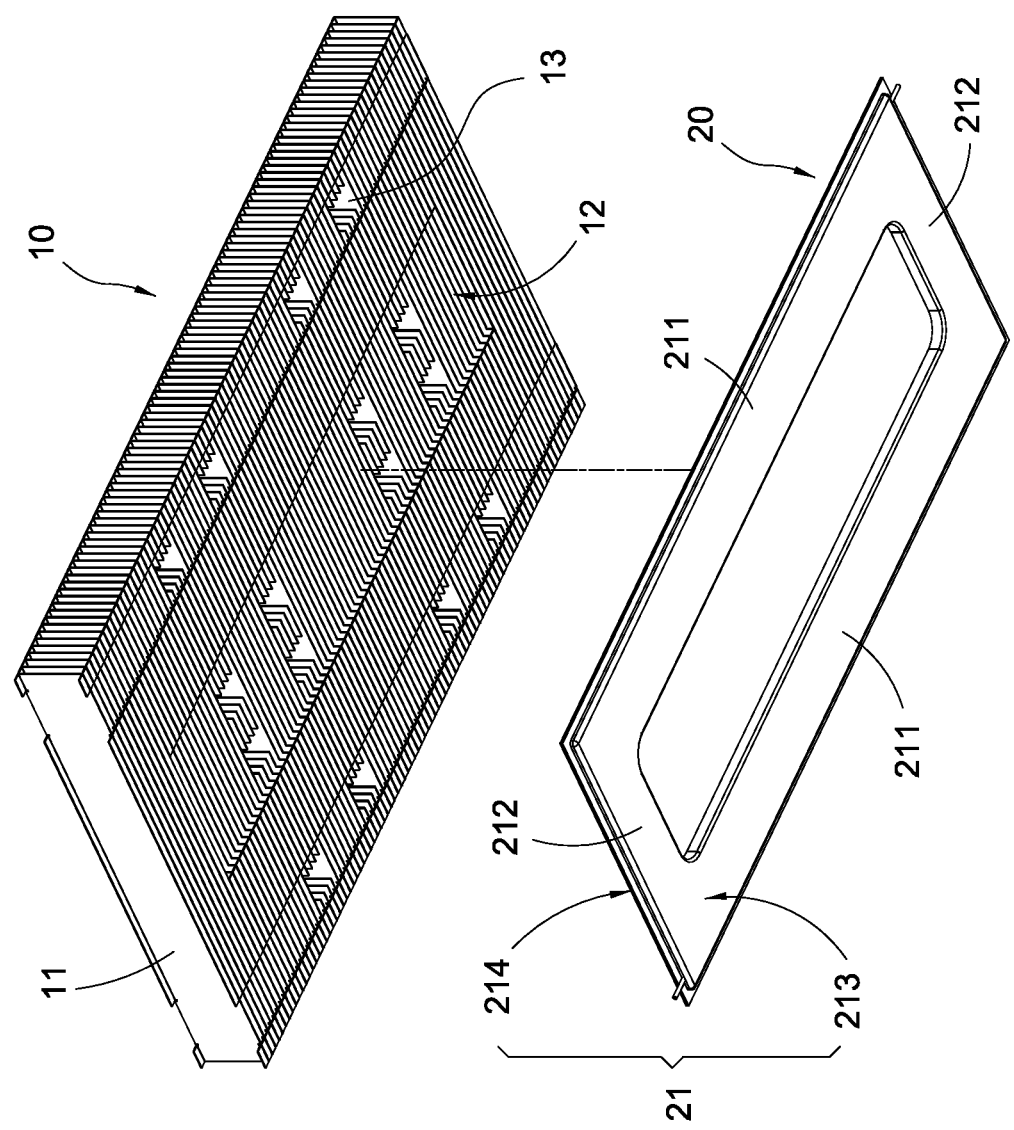
FIG. 1 is an exploded perspective view of the present invention.
Figure 2:
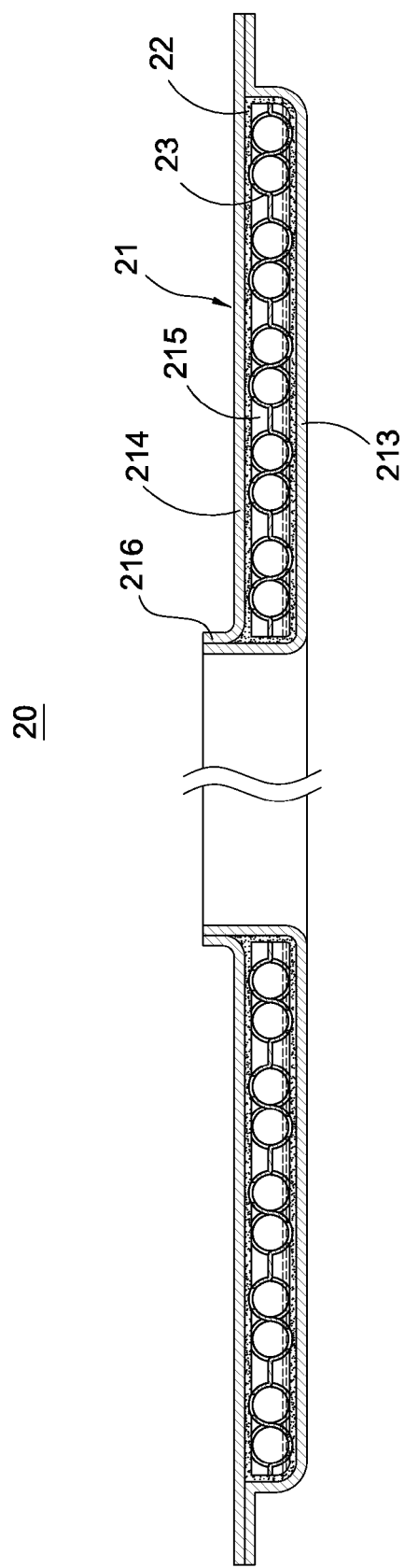
FIG. 2 is a cross-sectional view showing the loop-type vapor chamber of the present invention.

Please refer to FIGS. 1 and 2. FIG. 1 is an exploded perspective view of the present invention, and FIG. 2 is a cross-sectional view showing the loop-type vapor chamber of the present invention. The present invention provides a heat-dissipating module having a loop-type vapor chamber, which includes a heat-dissipating body 10, a loop-type vapor chamber 20, and a heat-conducting medium 30.

The heat-dissipating body 10 is constituted of a plurality of heat-dissipating pieces 11 arranged in parallel to each other at intervals. The heat-dissipating body 10 is provided with an insertion trough 12.

The loop-type vapor chamber 20 is enclosed by two long sides 211 and two short sides 212 to form a loop body 21 having a vacuum chamber 215. The loop body 21 comprises a bottom plate 213, a cover plate 214 covering the bottom plate 213, a wick structure 22 and a supporting structure 23 received in the vacuum chamber 215. The wick structure 22 is arranged on inner wall surfaces of the cover plate 214 and the bottom plate 213. The supporting structure 23 abuts the wick structure 22 toward the inner wall surfaces of the cover plate 214 and the bottom plate 213. The loop-type vapor chamber 20 is completely covered by the heat-dissipating body 10. The loop-type vapor chamber 20 is disposed at a position corresponding to the position of the insertion trough 12 of the heat-dissipating body 10. An outer surface of the cover plate 214 is formed with a loop-type protrusion 216, and the loop-type protrusion 216 is inserted into the insertion trough 12 of the heat-dissipating body 10. The insertion trough 12 has a shape corresponding to that of the loop-type protrusion 216. The circumference of the insertion trough 12 is larger than that of the loop-type protrusion 216.

Figure 3:
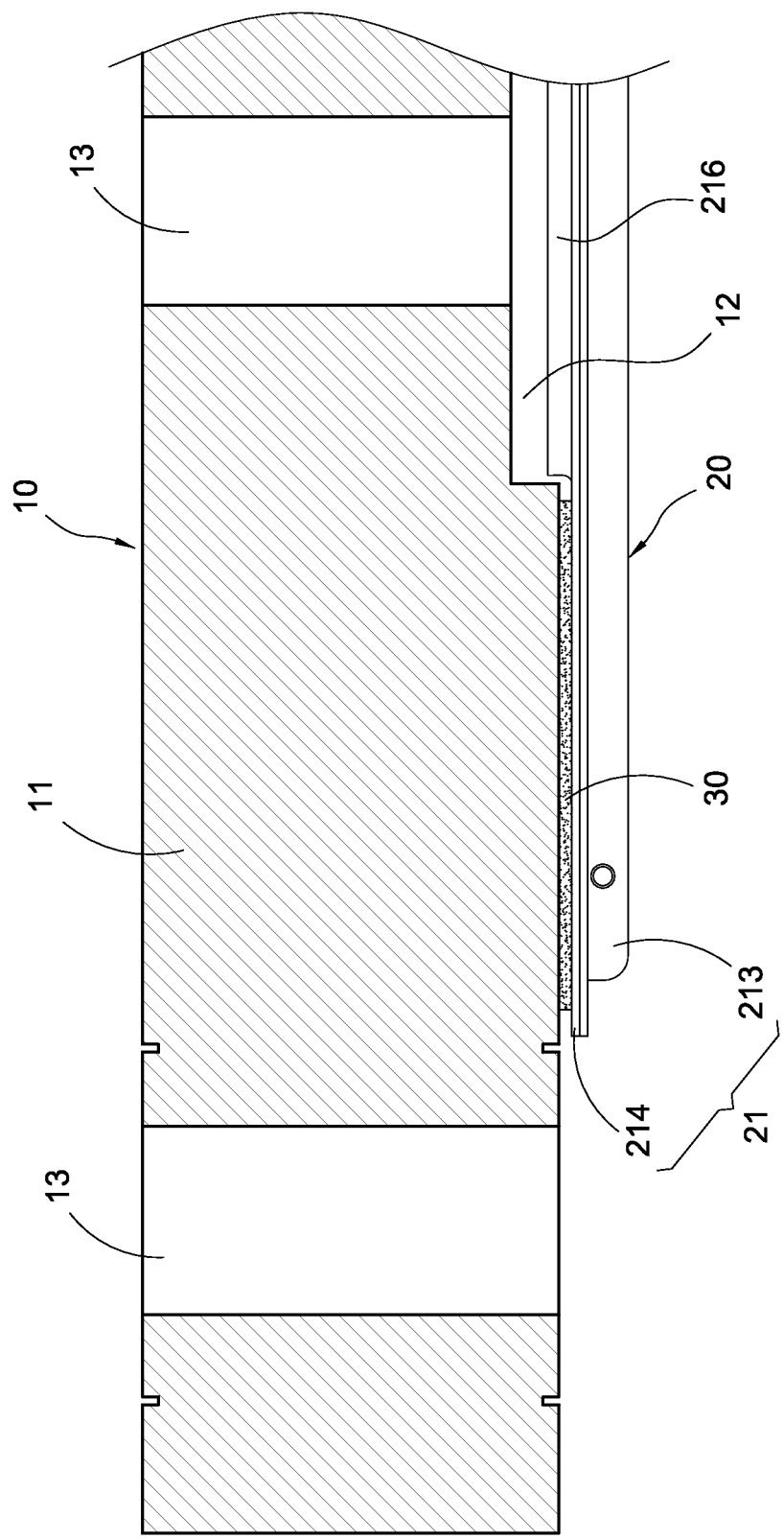
FIG. 3 is an assembled cross-sectional view of the present invention.

Please refer to FIG. 3, which is an assembled cross-sectional view of the present invention. The heat-conducting medium 30 may be heat-conducting glue or solder made of any one of Ag, Al, B, Zn, Sn and Si. The heat-conducting medium 30 is coated between the cover plate 214 of the loop body 21 and the heat-dissipating body 10. The heat-conducting medium 30 is capable of filling tiny gaps between the loop-type vapor chamber 20 and the heat-dissipating body 10, so that the loop-type vapor chamber 20 can be tightly connected to the heat-dissipating body 10 via the heat-conducting medium 30.

Figure 4:
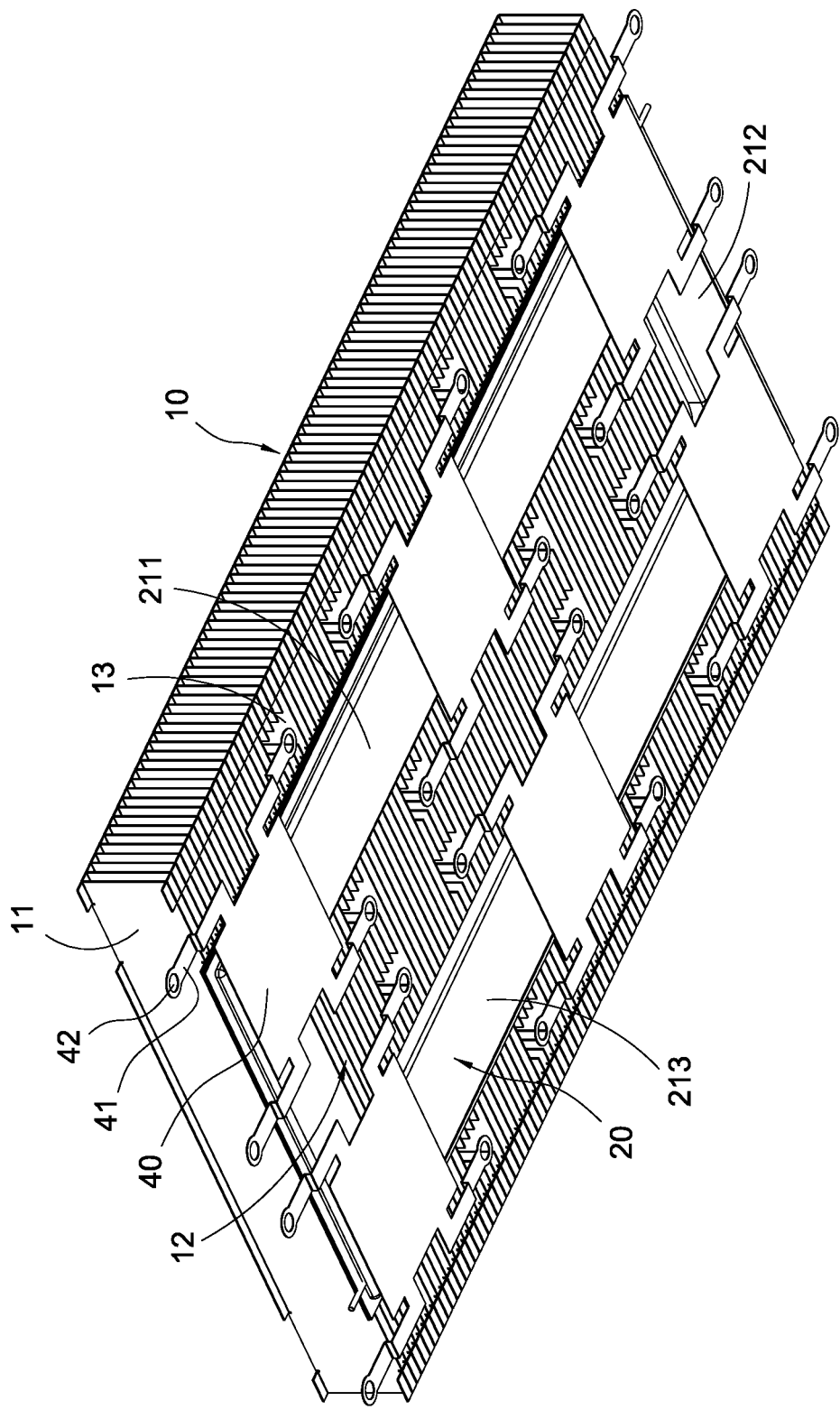
FIG. 4 is an assembled perspective view of the present invention.
Figure 5:
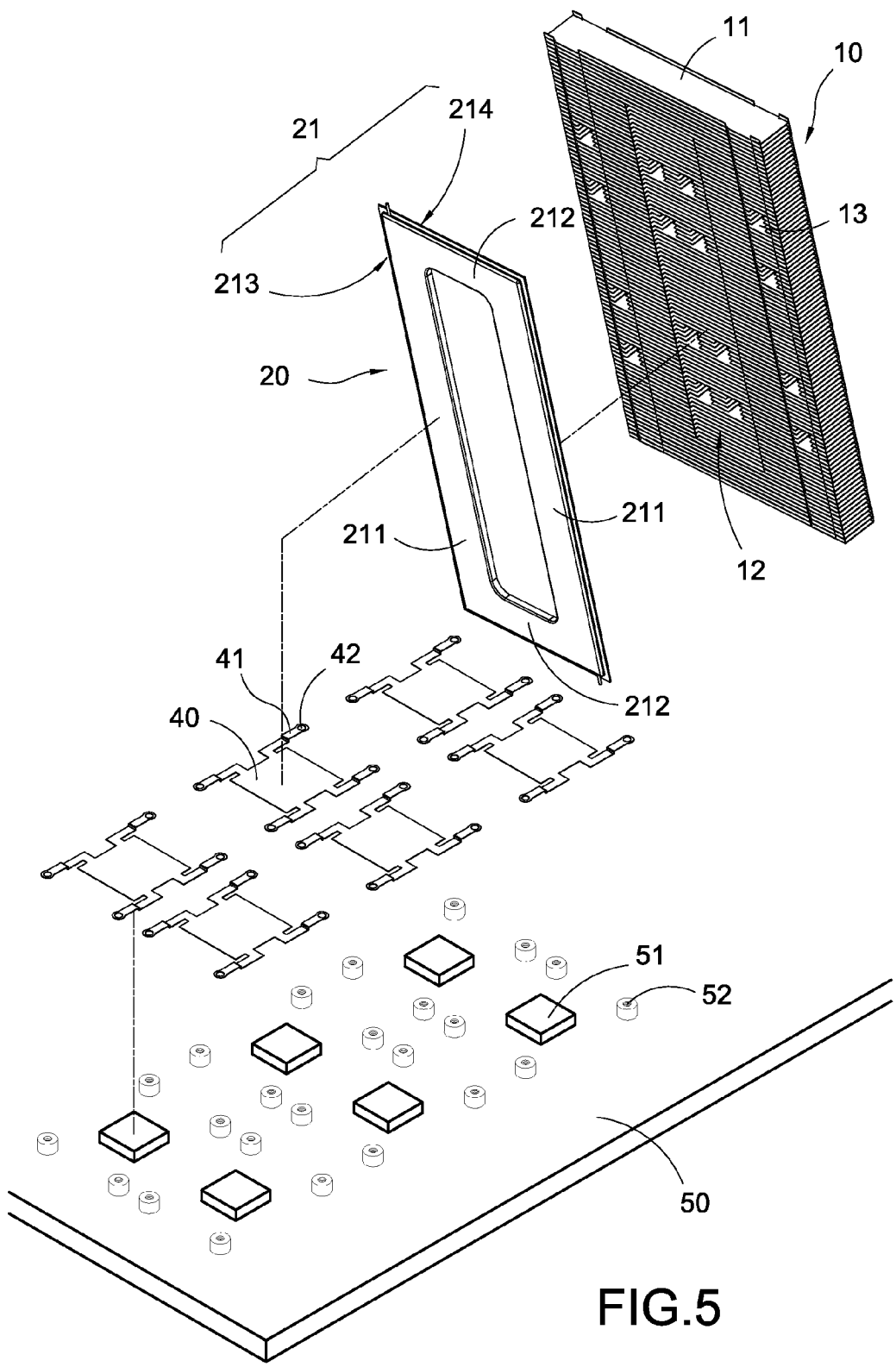
FIG. 5 is an exploded perspective view showing another embodiment of the present invention.
Figure 6:
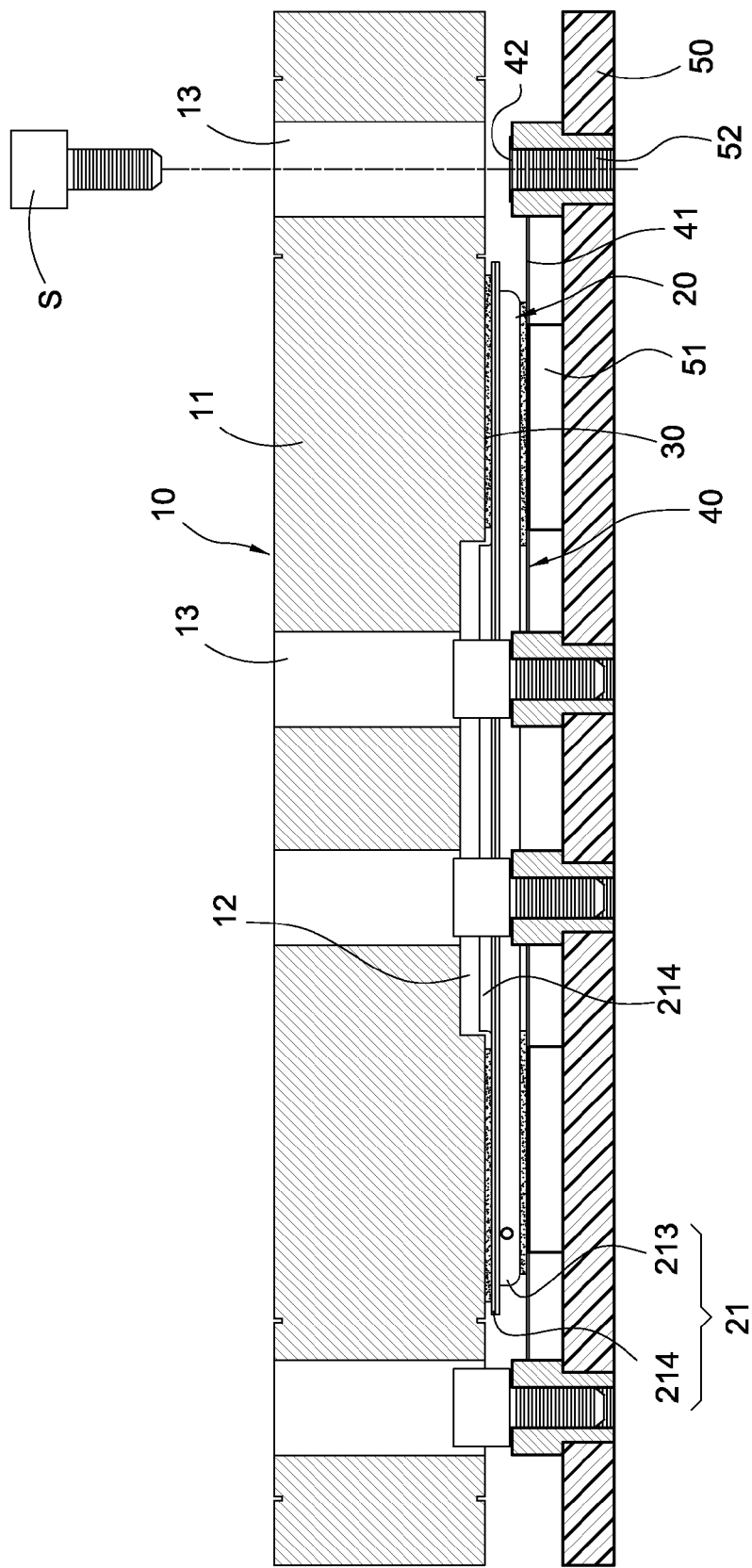
FIG. 6 is an assembled cross-sectional view showing another embodiment of the present invention.

Please refer to FIGS. 4 and 5. FIG. 4 is an assembled perspective view of the present invention, and FIG. 5 is an exploded perspective view showing another embodiment of the present invention. The heat-dissipating module further has a plurality of fixing plates 40 and a plurality of screws S. The fixing plates 40 are connected to the outer surface of the bottom plate 213 in such a manner that they are arranged in parallel to each other symmetrically. Some of the fixing plates 40 are disposed to cross the long side 211 and the short sides 212, and the rest of the fixing plates 40 are disposed to cross in the middle part of the long sides 211. One surface of each fixing plate 40 away from the bottom plate 213 is brought into thermal contact with the heat-generating electronic elements 51 of the circuit board 50. Both sides of the fixing plate 40 extend to form a pair of legs 41. Each leg 41 has a through-hole 42. The heat-dissipating body 10 is provided with a plurality of penetration holes 13 corresponding to the through-hole 42 of each leg 41. The circuit board 50 is provided with a plurality of screw holes 52 corresponding to the through-holes 42 respectively. As shown in FIG. 6, the screws S penetrate the penetration holes 13, the through-holes 42, and the screw holes 52 of the circuit board 50 to thereby fixing the heat-dissipating module onto the circuit board 50. In this way, the electronic elements 51 on the circuit board 50 can be brought into thermal contact with the fixing plates 40 respectively.

Please refer to FIG. 6, which is an assembled cross-sectional view showing another embodiment of the present invention. In use, the heat-dissipating body 10 covers the loop-type vapor chamber 20 via the heat-conducting medium 30. Then, each fixing plate 40 is connected to the outer surface of the bottom plate 213. Each electronic element 51 is brought into thermal contact with one surface of each fixing plate 40 away from the bottom plate 213. Finally, the screws penetrate the penetration holes 13, the through-holes 42 and the screw holes 52 of the circuit board 50 to thereby fixing the heat-dissipating module to the circuit board 50. In this way, the electronic elements 51 on the circuit board 50 can be brought into thermal contact with the heat-dissipating module tightly.

Figure 7:
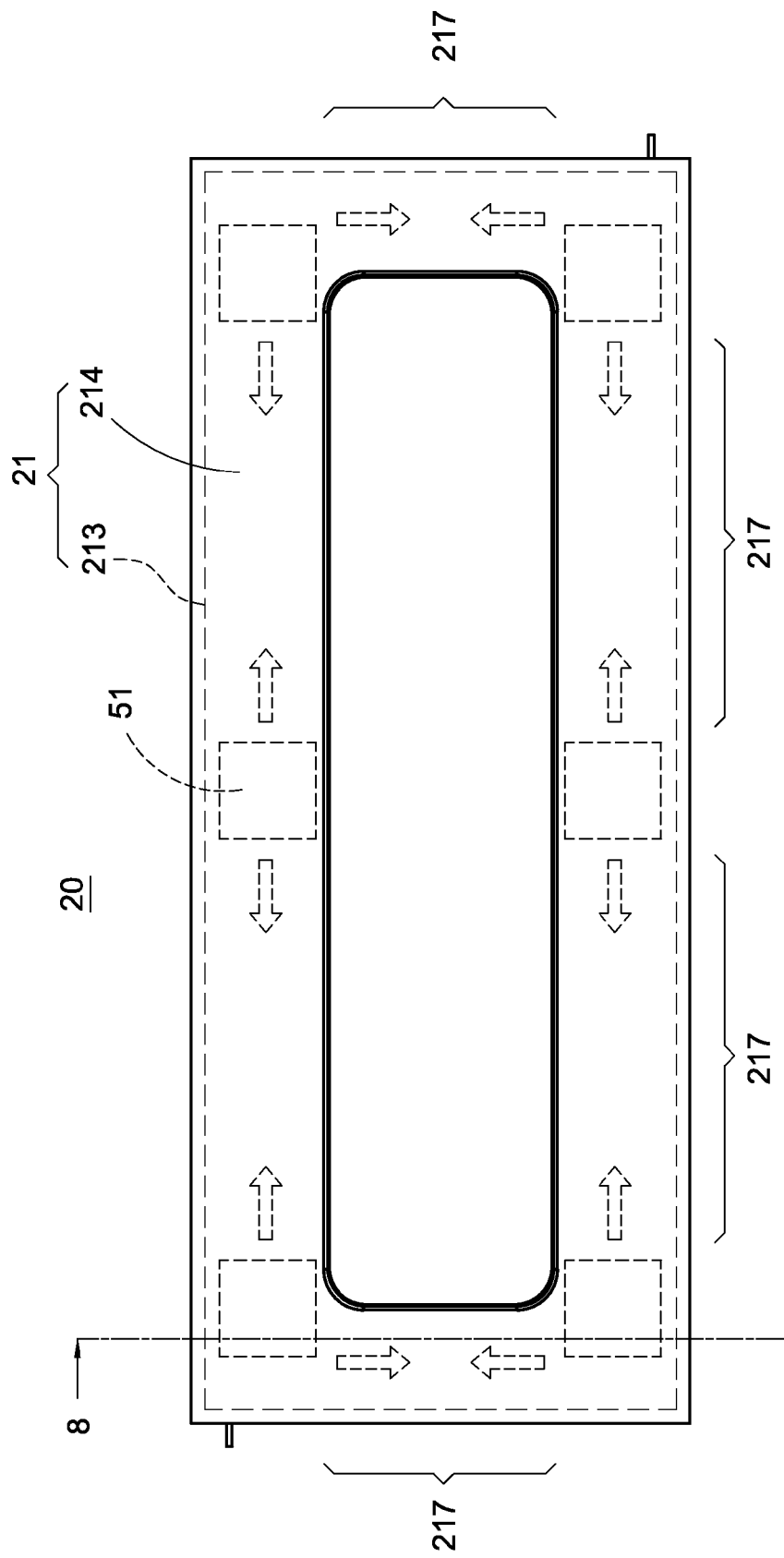
FIG. 7 is a schematic view showing the flowing state of the working fluid in the loop-type vapor chamber of the present invention.

Please refer to FIGS. 7 and 8. FIG. 7 is a schematic view showing the flowing state of the working fluid in the loop-type vapor chamber according to the present invention, and FIG. 8 is a cross-sectional view taken along the line 8-8 in FIG. 7. First, a portion of the bottom plate 213 connected with the electronic elements 51 acts as an evaporating portion 2131, and a portion of the cover plate 214 corresponding to the evaporating portion 2131 acts as a condensing portion 2141. A portion of the loop body 21 not connected with the electronic elements 51 acts as a separation portion 217. When the electronic elements 51 generate heat in their operation, the heat is conducted to the evaporating portion 2131 of the bottom plate 213 via the fixing plates 40 and then conducted to the liquid-phase working fluid A in the evaporating portion 2131. The liquid-phase working fluid A absorbs the heat to become vapors. A portion of the vapor-phase working fluid A moves toward the condensing portion 2141, and the other portion of the vapor-phase working fluid A moves toward the separation portions 217 of the loop body 21 due to the pressure difference. In this way, the heat contained in the vapor-phase working fluid A is transferred to the cover plate 214 via the condensing portion 2141 and the separation portions 217. Further, since the heat-conducting medium 30 is coated between the cover plate 214 and the heat-dissipating body 10, the heat transferred to the cover plate 214 can be rapidly conducted to the heat-dissipating body 10 via the heat-conducting medium 30. Then, the heat-dissipating body 10 is heat-exchanged with the external air, thereby transferring the heat to the external air and thus achieving a heat-dissipating effect. Thereafter, the vapor-phase working fluid A condenses into the liquid-phase working fluid A in the condensing portion 2141 and the separation portions 217, and the condensed droplets are absorbed by the wick structure 22 in the condensing portion 2141 and the separation portions 27. In the condensing portion 2141, the liquid-phase working fluid A absorbed by the wick structure 22 flows back to the evaporating portion 2131 via the capillary force or along the supporting structure 23. In the separation portions 217, the liquid-phase working fluid A flows back to the wick structure in of the evaporating portion 2131 via the capillary force or flows back to the wick structure 22 in the bottom plate 213 along the wick structure 22 of the cover plate 214. Finally, the liquid-phase working fluid flows back to the wick structure 22 in the evaporating portion 2131.

Thus, the loop-type vapor chamber 20 can drive low-temperature liquid-phase working fluid A at several locations to the evaporating portion 2131, thereby cooling the electronic elements 51 at the respective locations. Therefore, not only the heat-dissipating effect thereof is increased, but also the temperatures of the electronic elements 51 acting as the heat sources are lowered respectively. Further, since the path from the condensing portion 2141 and the separation portions 217 to the evaporating portion 2131 is short, the temperature of the liquid-phase working fluid A arriving the evaporating portion 2131 is substantially equal to the temperature of the liquid-phase working fluid A contained in the condensing portion 2141 and the separation portions 217. Thus, the liquid-phase working fluid A arriving the evaporating portion 2131 can be used to absorb sufficient amount of heat to thereby generate a better cooling effect.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A heat-dissipating module having a loop-type vapor chamber, including:
   a heat-dissipating body provided with an insertion trough;
   the loop-type vapor chamber located at a position corresponding to that of the insertion trough and completely covered by the heat-dissipating body, the loop-type vapor chamber comprising a loop body, a wick structure and a supporting structure, the loop body comprising a bottom plate and a cover plate covering the bottom plate, a vacuum chamber being formed between the bottom plate and the cover plate, the wick structure being arranged on inner surfaces of the cover plate and the bottom plate, the supporting structure abutting the wick structure toward the cover plate and the bottom plate; and
   a heat-conducting medium by which the loop-type vapor chamber is tightly connected to the heat-dissipating body,
   wherein an outer surface of the cover plate is formed with a loop-type protrusion, and the loop-type protrusion is inserted into the insertion trough of the heat-dissipating body.

2. The heat-dissipating module having a loop-type vapor chamber according to claim 1, wherein the insertion trough of the heat-dissipating body has a shape corresponding to that of the loop-type protrusion, and the circumference of the insertion trough is larger than that of the loop-type protrusion.

3. The heat-dissipating module having a loop-type vapor chamber according to claim 2, wherein the heat-dissipating body is constituted of a plurality of heat-dissipating pieces arranged at intervals.

4. The heat-dissipating module having a loop-type vapor chamber according to claim 3, wherein the heat-conducting medium is heat-conducting glue or solder made of any one of Ag, Al, B, Zn and Si.

5. A heat-dissipating module having a loop-type vapor chamber, mounted on a plurality of heat-generating electronic elements of a circuit board and including:
   a heat-dissipating body;
   the loop-type vapor chamber disposed on one side of the heat-dissipating body and completely covered by the heat-dissipating body, the loop-type vapor chamber comprising a loop body, a wick structure and a supporting structure, the loop body being enclosed by two long sides and two short sides to form a hollow rectangular body, a vacuum chamber being formed in the interior of the long sides and the short sides, the wick structure being arranged on inner surfaces of the long sides and the short sides, the supporting structure abutting the wick structure toward the inner surfaces of the long sides and the short sides;
   a heat-conducting medium by which the loop-type vapor chamber is tightly connected to the heat-dissipating body; and
   a plurality of fixing plates, some of the fixing plates being disposed to cross connecting portions between the long sides and the short sides, and the rest of the fixing plates being disposed to cross the long sides, the fixing plates being arranged in parallel to each other symmetrically and positioned to correspond to the heat-generating electronic elements respectively.

6. The heat-dissipating module having a loop-type vapor chamber according to claim 5, wherein the loop body comprises a bottom plate and a cover plate covering the bottom plate, and the vacuum chamber is formed between the bottom plate and the cover plate.

7. The heat-dissipating module having a loop-type vapor chamber according to claim 6, wherein a surface of the cover plate is formed with a loop-type protrusion, the heat-dissipating body has an insertion trough having a shape corresponding to that of the loop-type protrusion, the loop-type protrusion is inserted into the insertion trough of the heat-dissipating body, and the circumference of the insertion trough is larger than that of the loop-type protrusion.

8. The heat-dissipating module having a loop-type vapor chamber according to claim 7, wherein both sides of each fixing plate extend to form a pair of legs respectively, and each of the leg has a through-hole.

9. The heat-dissipating module having a loop-type vapor chamber according to claim 8, wherein the heat-dissipating body has a plurality of penetration holes corresponding to the through-holes of the legs respectively.

10. The heat-dissipating module having a loop-type vapor chamber according to claim 9, further including a plurality of screws, wherein the circuit board further has a plurality of screw holes corresponding to the through-holes, the screws penetrate the penetration holes, the through-holes, and the screw holes of the circuit board to thereby fix the electronic elements onto the fixing plates.

11. The heat-dissipating module having a loop-type vapor chamber according to claim 10, wherein the heat-dissipating body includes a plurality of heat-dissipating pieces arranged at intervals.

12. The heat-dissipating module having a loop-type vapor chamber according to claim 11, wherein the heat-conducting medium is heat-conducting glue or solder made of any one of Ag, Al, B, Zn, Sn and Si.

* * * * *